US008700972B2

(12) United States Patent
Penzes et al.

(10) Patent No.: US 8,700,972 B2
(45) Date of Patent: Apr. 15, 2014

(54) ADAPTIVE ULTRA-LOW VOLTAGE MEMORY

(75) Inventors: Paul Penzes, Irvine, CA (US); Mark Fullerton, Austin, TX (US); Ajat Hukkoo, Cupertino, CA (US); John Walley, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 123 days.

(21) Appl. No.: 13/289,691

(22) Filed: Nov. 4, 2011

(65) Prior Publication Data

US 2013/0117626 A1  May 9, 2013

Related U.S. Application Data

(60) Provisional application No. 61/524,538, filed on Aug. 17, 2011.

(51) Int. Cl.
*H03M 13/00* (2006.01)
*G11C 29/00* (2006.01)

(52) U.S. Cl.
USPC .......................................... 714/758; 714/762

(58) Field of Classification Search
USPC .......................................... 714/701, 758, 763
See application file for complete search history.

(56) References Cited

U.S. PATENT DOCUMENTS

| 8,433,980 B2* | 4/2013 | Alrod et al. ................... 714/773 |
| 2005/0080994 A1 | 4/2005 | Cohen et al. |
| 2010/0082905 A1 | 4/2010 | Wilkerson et al. |
| 2010/0146368 A1* | 6/2010 | Chishti et al. ................. 714/755 |
| 2010/0191990 A1* | 7/2010 | Zhang et al. ................... 713/320 |
| 2011/0209030 A1* | 8/2011 | Lee et al. ....................... 714/758 |
| 2012/0124448 A1* | 5/2012 | Emerson et al. ............... 714/758 |

OTHER PUBLICATIONS

Zeshan Chishti, Alaa R. Alameldeen, Chris Wilkerson, Wei Wu, and Shih-Lien Lu. 2009. Improving cache lifetime reliability at ultra-low voltages. In Proceedings of the 42nd Annual IEEE/ACM International Symposium on Microarchitecture (MICRO 42). ACM, New York, NY, USA, 89-99.*
European Search Report for EP Application No. EP 12 00 5759, The Hague, Netherlands, mailed on Jan. 3, 2013.
International Search Report and Written Opinion for International Application No. PCT/US2012/051453, European Patent Office, Netherlands, mailed on Jan. 4, 2013.

* cited by examiner

*Primary Examiner* — Cynthia Britt
(74) *Attorney, Agent, or Firm* — Sterne, Kessler, Goldstein & Fox P.L.L.C.

(57) ABSTRACT

Embodiments provide an adaptive memory that allows for low voltage modes of operation. In the low voltage modes of operation, the supply voltage provided to the memory is reduced below Vcc(min), which allows for significant savings in the power consumption of circuit components (e.g., the CPU) whose minimum voltage is dictated by Vcc(min). According to further embodiments, the memory can be configured dynamically according to various configurations depending on desired power savings (e.g., target Vcc(min)) and/or performance requirements (e.g., reliability, cache size requirement, etc.).

19 Claims, 7 Drawing Sheets

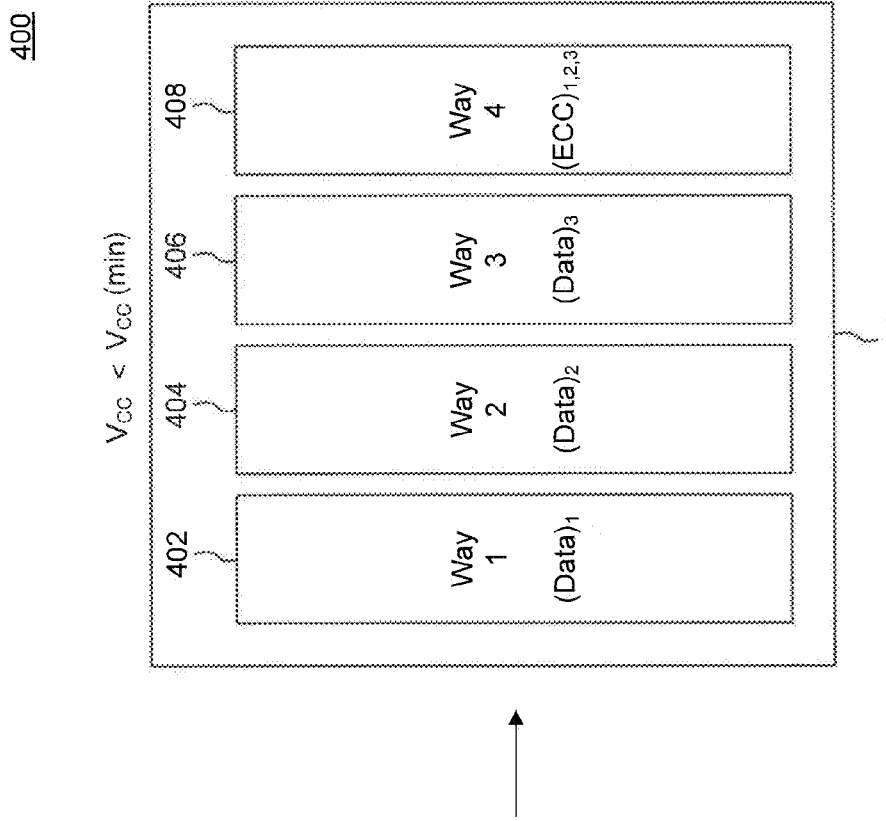
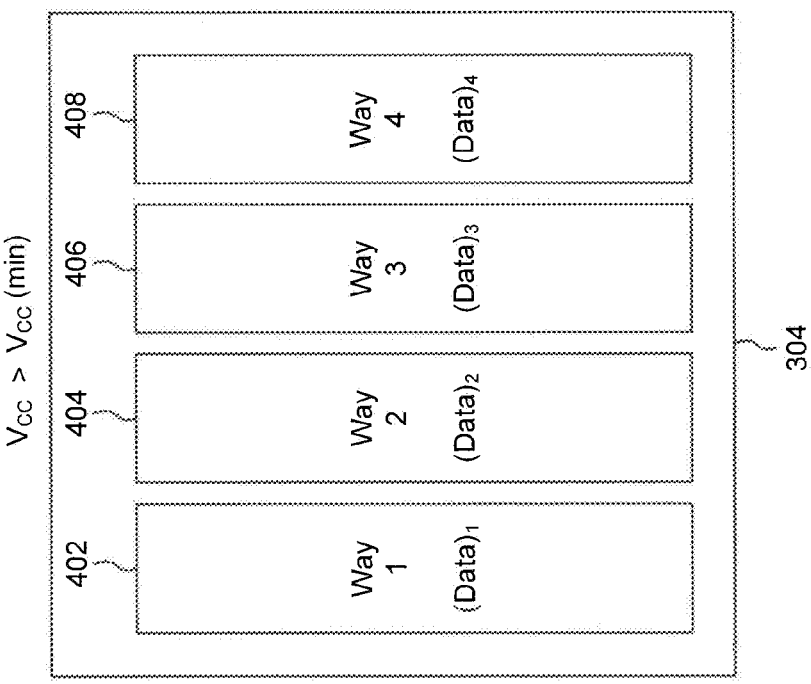
FIG. 4

ADAPTIVE ULTRA-LOW VOLTAGE MEMORY

CROSS REFERENCE TO RELATED APPLICATIONS

This patent application claims the benefit of U.S. Provisional Patent Application No. 61/524,538, filed Aug. 17, 2011.

BACKGROUND

1. Field of the Invention

The present invention relates generally to computer memory.

2. Background Art

Conventional computer memories set a conservative minimum required supply voltage for the memory. This minimum memory supply voltage is typically determined by a voltage below which the first bitcell failure in the memory occurs.

When the memory is integrated with other circuit components (e.g., processor), the minimum memory supply voltage generally dictates the minimum supply voltage for the overall integrated circuit. (Though, the memory supply voltage may be separated from the supply voltage of the rest of the chip, doing so usually requires another supply regulator and impacts the timing of the memory). As such, the other circuit components are prevented from operating at voltages lower than the minimum memory supply voltage, even when the other circuit components are capable of or desire operating at lower voltages in reduced power/performance modes.

Further, even when a separate memory supply voltage is used, the minimum required memory supply voltage is typically set very conservatively that power savings can potentially be achieved by reducing the supply voltage below the minimum, before memory performance is affected in a significant way.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 4 illustrates an example re-configuration of an adaptive cache memory according to an embodiment of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
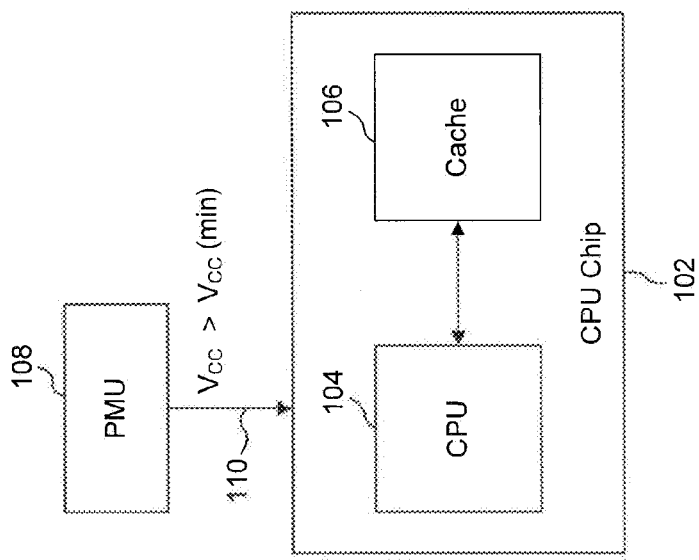
FIG. 1 illustrates a portion of an example computer system.

FIG. 1 illustrates a portion of an example computer system 100. As shown in FIG. 1, computer system 100 includes a Central Processing Unit (CPU) chip 102 and a Power Management Unit (PMU) 108.

CPU chip 102 includes a CPU 104 and a cache memory 106. CPU 104 uses cache memory 106 to store and retrieve data and/or instructions that are repeatedly required to run programs. Cache memory 106 is faster than a main memory (not shown in FIG. 1) of computer system 100, which allows computer system 100 to run at an improved overall system speed.

PMU 108 is a controller that performs several power-related functions within computer system 100, including controlling and providing power to the various circuit components of computer system 100. As such, PMU 108 provides power to CPU chip 102. Typically, PMU 108 includes a switch regulator or DC-DC converter (not shown in FIG. 1). PMU 108 uses the switch regulator or DC-DC converter to regulate a DC voltage provided from a battery, for example, to generate and provide an appropriate voltage Vcc 110 to CPU chip 102.

Generally, the value of Vcc 110 is bounded by a maximum value, defined by the process technology of CPU chip 102, and a minimum value, Vcc(min). Typically, Vcc(min) for CPU chip 102 is determined by a voltage below which memory cells in cache memory 106 begin to fail. For example, Vcc(min) may be set at a guard level above the voltage for which the first memory bitcell failure occurs in cache memory 106. Vcc(min) may be determined by testing cache memory 106. In other implementations, a fixed portion of cache memory 106 is used to store error correction bits (the error correction bits are statically pre-allocated according to a fixed error correction scheme) for the rest of the data contained in cache memory 106. As such, Vcc(min) will be determined by the voltage for which at least one bit corruption cannot be reliably corrected by the fixed error correction scheme (i.e., the voltage for which the correction scheme can no longer correct all bit corruptions).

CPU 104, which is made of logic circuits, can operate reliably at voltages lower than Vcc(min). It is desirable to operate CPU 104 at lower voltages, to reduce power consumption, when high processor performance is not required. However, because of its integration with cache memory 106, the minimum voltage at which CPU 104 can be operated is dictated by Vcc(min).

Figure 2:
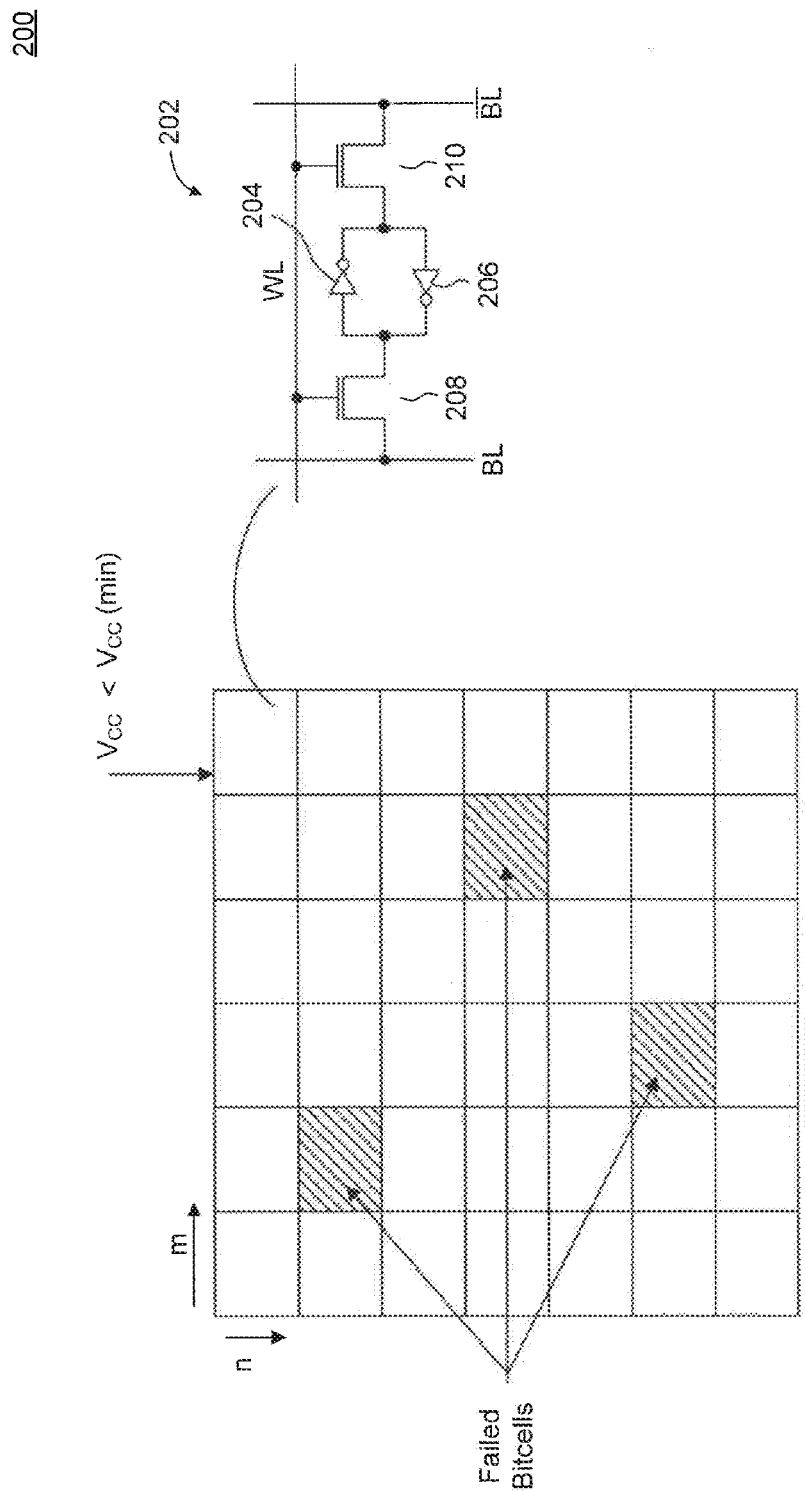
FIG. 2 illustrates the behavior of an example memory array as supply voltage is reduced below a minimum operating voltage.

FIG. 2 illustrates the behavior of an example memory array 200 as supply voltage is reduced below Vcc(min). Example array 200 is a memory array that comprises m×n bitcells. Each bitcell may be a bitcell like that shown as bitcell 202. Bitcell 202 is a 6-transistor (6T) bitcell, which includes a cross-coupled inverter pair 204, 206, and two access transistors 208 and 210. Bitcell 202 is accessed to read/write data using a bit line (BL) and a word line (WL). Transistor 208 may be the access transistor to read bitcell 202, while transistor 210 may be the access transistor to write bitcell 202, or vice versa.

As long as the supply voltage to memory array 200 is above Vcc(min), bitcell 202 remains stable, in the sense that the outputs of the cross-coupled inverter pair 204, 206 remain either a solid logic 1 or a solid logic 0. However, as the supply voltage is reduced below Vcc(min), the stability of bitcell 202 becomes a concern, with the outputs of the inverter pair 204, 206 becoming more prone to toggling (flipping) between a logic 1 and a logic 0. When bitcell 202 begins to toggle, bitcell 202 is considered failed because it can no longer hold a stable value.

Typically, the supply voltage value for which the first bitcell in memory array 200 begins to toggle is used to determine the Vcc(min) for memory array 200. For example, Vcc(min) is set at a guard level above the voltage for which the first bitcell begins to toggle. Because of process and parameter variations, the bitcells of memory array 200 do not all begin to toggle at the same time, and thus do not fail all at once as the supply voltage to memory array 200 is reduced. Accordingly, in conventional designs, Vcc(min) is set in a very conservative manner.

Embodiments of the present invention, as further described below, recognize and exploit the fact that memory cell failures do not occur all at once as the supply voltage to a memory is reduced, and that, accordingly, a subset of the memory cells can be assumed to remain operational at lower voltages. As such, embodiments provide an adaptive memory that allows for low voltage modes of operation. In the low voltage modes of operation, the supply voltage provided to the memory is reduced below Vcc(min), which allows for significant savings in the power consumption of circuit components (e.g., the CPU) whose minimum voltage is dictated by Vcc(min). According to further embodiments, the memory can be configured dynamically according to various configurations depending on desired power savings (e.g., target Vcc(min)) and/or performance requirements (e.g., speed, reliability, cache size, etc.).

In the following, example embodiments will be provided. These example embodiments are provided for the purpose of illustration and are not limiting. Embodiments will be described with reference to the particular example of a cache memory. However, embodiments are not limited to a cache memory, and can be extended to other types of memory as would be understood by a person of skill in the art based on the teachings herein. Further, embodiments will be described in the context of an example computer system. Embodiments are not limited by this example and can be applied to any device that may benefit from the embodiments described herein, as would be understood by a person of skill in the art based on the teachings herein.

Figure 3:
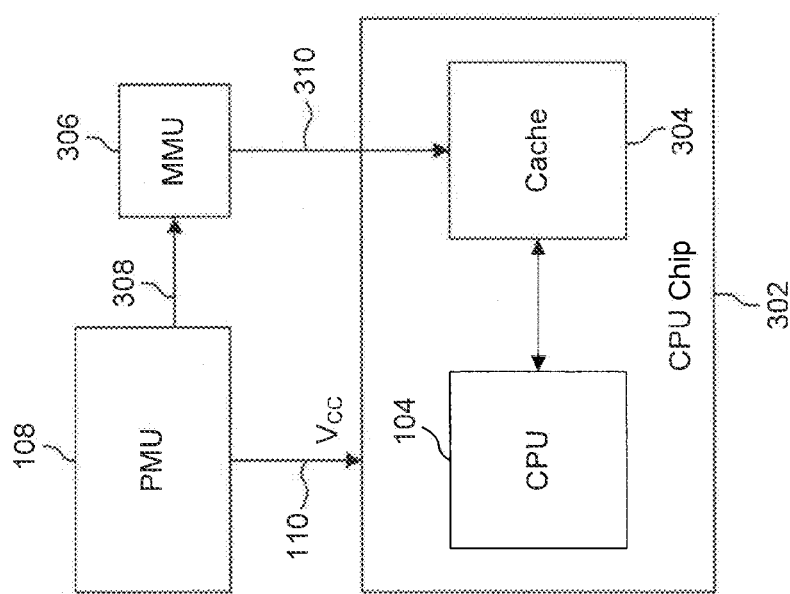
FIG. 3 illustrates an example computer system with an adaptive cache memory according to an embodiment of the present invention.

FIG. 3 illustrates a portion of an example computer system 300 with an adaptive cache memory according to an embodiment of the present invention. As shown in FIG. 3, computer system 300 includes a CPU chip 302, PMU 108, and a Memory Management Unit (MMU) 306. CPU chip 302 includes a CPU 104 and a cache memory 304.

PMU 108 provides a supply voltage Vcc 110 to CPU chip 302. During a normal mode of operation of CPU 104, Vcc 110 is above a Vcc(min) of CPU chip 302. In this mode, cache memory 304 is useable to its full capacity (i.e., all bitcells are stable), and is thus used in its entirety to store data.

In a low power/performance mode of operation of CPU 104, Vcc 110 is reduced below the Vcc(min) of CPU chip 302. In embodiments, CPU 104 may have several low power/performance modes of operation (e.g., low, very low, ultra-low), each with a corresponding power and performance (e.g., processor speed) profile. Accordingly, Vcc 110 may be set to one of several voltage values below the Vcc(min), depending on the selected low power/performance mode in order to save power.

With Vcc 110 below the Vcc(min) of CPU chip 302, some of the bitcells of cache memory 304 begin to fail, with some bitcell failures being predictable (i.e., that repeat for the same Vcc value) and others unpredictable. In an embodiment, cache memory 304 is characterized by a priori testing to determine a probability density function (PDF) of bitcell failure as a function of Vcc. Based on this PDF, a useable percentage of cache memory 304 can be predicted for a particular value of Vcc. For example, for Vcc at 30% below Vcc(min), 50% of cache memory 304 may still be useable. The same characterization can also be performed, alternatively or additionally, as a function of temperature. In another embodiment, cache memory 304 is characterized by testing so as to identify bitcells that consistently fail for particular values of Vcc. This type of characterization identifies repeatable bitcell failures. With one or both types of characterizations, the available capacity or useable portions of cache memory 304 can be determined, which allows cache memory 304 to be adapted as a function of Vcc, as further described below.

MMU 306 controls cache memory 304 via a control signal 310 to adapt cache memory 304 based on the mode of operation of CPU 104. In an embodiment, MMU 306 receives a signal 308 from PMU 108, which includes information about a scheduled mode of operation of CPU 104. For example, signal 308 may include, without limitation, one or more of a Vcc value, a cache size requirement, and a desired hit/miss rate for the scheduled mode of operation. In addition, signal 308 may include a future time at which CPU 104 is expected to enter the scheduled mode of operation. In other embodiments, configuration of cache memory 304 is performed by a cache association logic, which would perform the same function as described herein with reference to MMU 306

Based on signal 308, MMU 306 determines an appropriate configuration of cache memory 304 to support CPU 104 for the selected mode of operation. As further described below, according to embodiments, cache memory 304 can be configured according to various configurations depending on the mode of operation of CPU 104. This includes taking into account the desired power savings (e.g., the target Vcc(min)) and/or performance requirements (e.g., reliability, cache size, speed, etc.) of the CPU mode of operation. As the CPU mode of operation is adjusted, cache memory 304 can be adapted dynamically to enhance power savings and enable acceptable performance.

In the following, example embodiments for re-configuring a cache memory based on the CPU mode of operation are provided. These examples are provided for the purpose of illustration and are not limiting of embodiments. For example, the embodiments are described with respect to a cache memory having four ways. As would be understood by a person of skill in the art based on the teachings herein, embodiments can be applied to a cache memory of any size (i.e., number of ways) as well as to other types of memory, including, without limitation, random access memory (RAM), Static RAM (SRAM), Dynamic RAM (DRAM), read-only memory (ROM), programmable ROM (PROM), and one-time programmable (OTP) memory. Further, embodiments may be applied to memories having different types of logical segmentation than ways.

FIG. 4 illustrates another example re-configuration 400 of an adaptive cache memory according to an embodiment of the present invention. For the purpose of illustration, example re-configuration 400 is described with reference to cache memory 304, described above in FIG. 3. It is assumed, for the purpose of illustration, that cache memory 304 includes four ways 402, 404, 406, and 408, which provide a logical segmentation of cache memory 304. As described above, embodiments are not limited to cache memory or to memory segmented into ways.

As shown in FIG. 4, cache memory 304 is initially operating in a normal mode of operation, where Vcc is above Vcc (min). In this mode, all four of ways 402, 404, 406, and 408 of cache memory 304 are made available for data caching.

Subsequently, cache memory 304 is re-configured into a low power mode of operation, with Vcc reduced below Vcc (min). In an embodiment, cache memory 304 is re-configured based on information contained in control signal 310 provided by MMU 306. In this example re-configuration, cache memory 304 is re-configured to have three data ways 402, 404, and 406 (i.e., ways dedicated for data caching) and one error correcting code (ECC) way 408. In an embodiment, ECC way 408 includes error correcting codes for the data contained in ways 402, 404, and 406. The size of cache memory 304 is accordingly reduced by 25% relative to the initial configuration to accommodate the ECC way.

Other configurations of cache memory 304 between data ways and ECC ways may be used. For example, the ratio of data ways to EEC ways may be different than described in FIG. 4. Also, the type and/or rate of the error correcting code may be varied from one configuration to another, and between ECC ways in a single configuration. For example, a lower rate code may be used for a higher ratio of data ways to ECC ways. Also, in a given configuration, some ECC ways may use stronger codes than others. This affects the error correction capability provided, and consequently the reliability of cache memory 304.

According to embodiments, cache memory 304 may transition between various modes of operation, and thus adapt dynamically the ratio of data ways to ECC ways, as well as the type/rate of error correction used. For example, based on an increased desired cache reliability, cache memory 304 may be adapted to retain the same size but only adjust the ECC strength. Similarly, if CPU performance requires a larger cache size, cache memory 304 may be adapted to increase the number of data ways at the expense of lower error correction efficiency.

Figure 5:
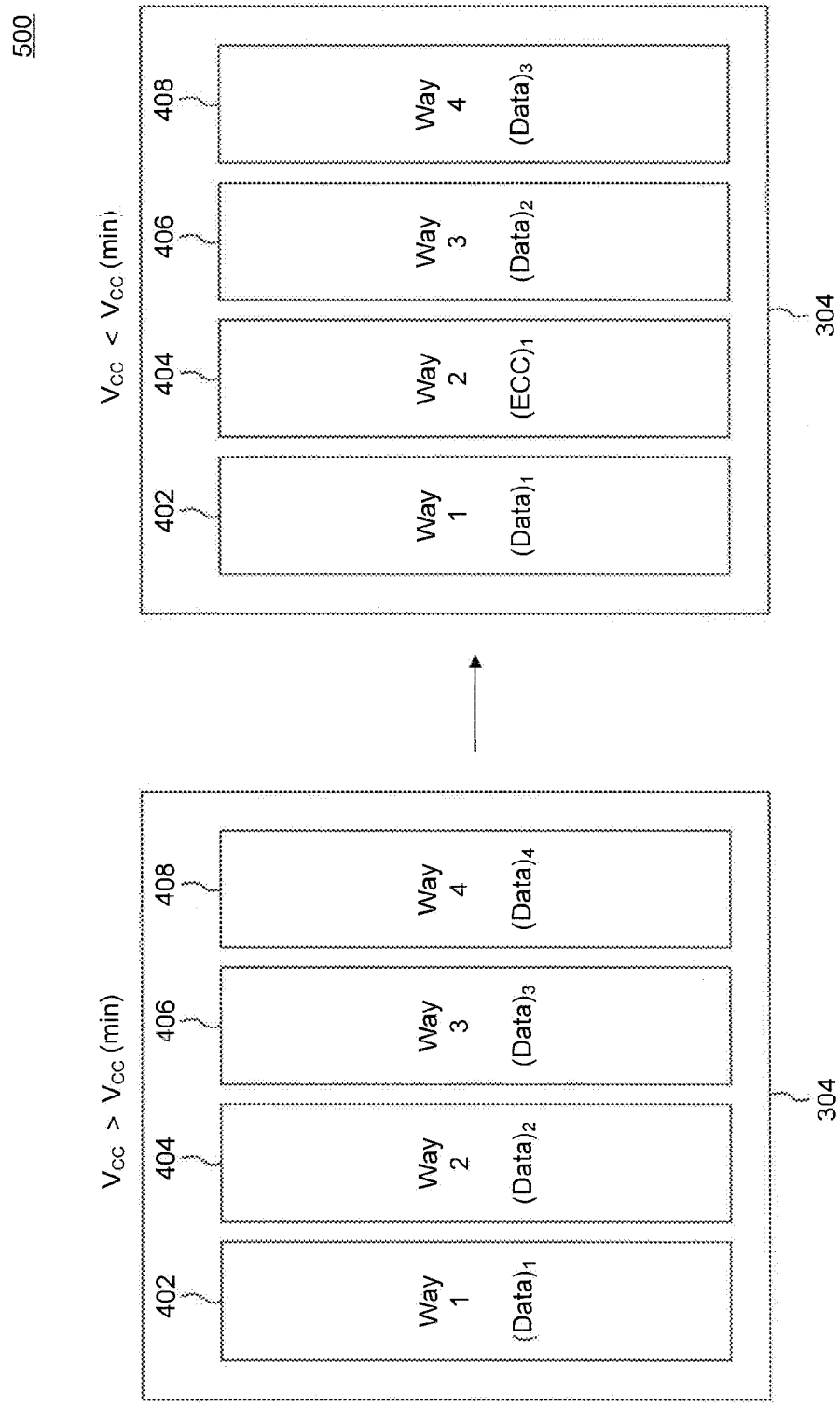
FIG. 5 illustrates an example re-configuration of an adaptive cache memory according to an embodiment of the present invention.

FIG. 5 illustrates another example re-configuration 500 of an adaptive cache memory according to an embodiment of the present invention. For the purpose of illustration, example re-configuration 500 is described with reference to cache memory 304, described above in FIG. 3. It is assumed, for the purpose of illustration, that cache memory 304 includes four ways 402, 404, 406, and 408, which provide a logical segmentation of cache memory 304. As described above, embodiments are not limited to cache memory or to memory segmented into ways.

As shown in FIG. 5, cache memory 304 is initially operating in a normal mode of operation, where Vcc is above Vcc (min). In this mode, all four of ways 402, 404, 406, and 408 of cache memory 304 are made available for data caching.

Subsequently, cache memory 304 is re-configured into a low power mode of operation, with Vcc reduced below Vcc (min). In an embodiment, cache memory 304 is re-configured based on information contained in control signal 310 provided by MMU 306. In this example re-configuration, cache memory 304 is re-configured to have three data ways 402, 406, and 408 and one error correcting code (ECC) way 404. ECC way 404 is dedicated to error correcting codes for the data contained in data way 402.

In an embodiment, data way 402 is designated for high priority or critical data. In another embodiment, data way 402 may be identified during testing as having a higher bitcell failure rate than data ways 406 and 408 (e.g., data way 402 may use a different bitcell type). In either of these embodiment, a dedicated ECC way 404 may be used to protect the data contained in data way 402. Alternatively or additionally, data redundancy as described in FIG. 4 may be used for further reliability.

As described above, cache memory 304 is controlled by MMU 306 via control signal 310. Thus, according to embodiments, control signal 310 may include any of the information described above, in order to configure or re-configure cache memory 304. For example, control signal 310 may include, without limitation, information designating ways as data ways or ECC ways, information associating particular ECC ways with respective data ways, information about the error correction for each ECC way, and information partitioning ways between data and ECC bits.

Figure 6:
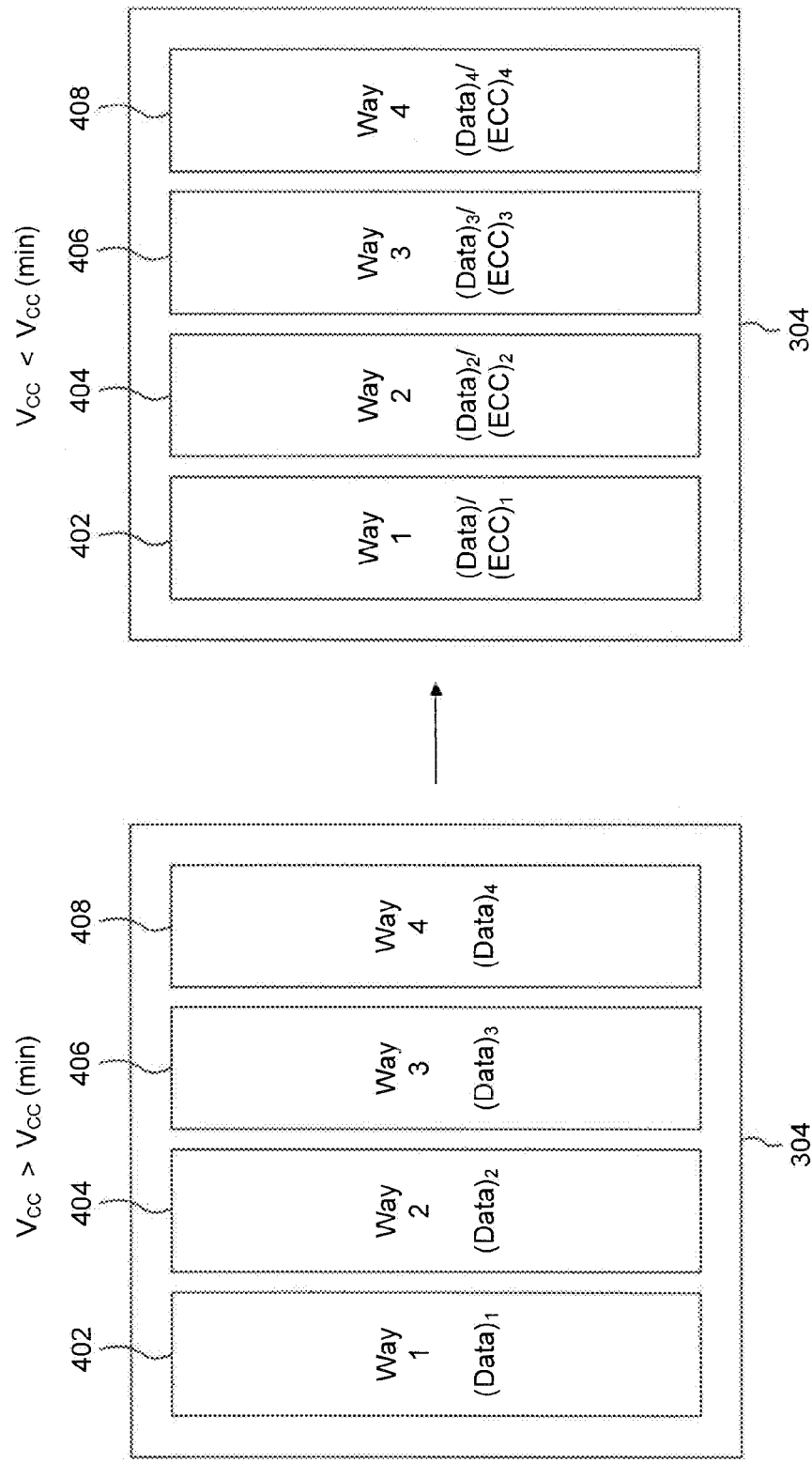
FIG. 6 illustrates an example re-configuration of an adaptive cache memory according to an embodiment of the present invention.

FIG. 6 illustrates an example re-configuration 600 of an adaptive cache memory according to an embodiment of the present invention. For the purpose of illustration, example re-configuration 600 is described with reference to cache memory 304, described above in FIG. 3. It is assumed, for the purpose of illustration, that cache memory 304 includes four ways 402, 404, 406, and 408, which provide a logical segmentation of cache memory 304. As described above, embodiments are not limited to cache memory or to memory segmented into ways.

As shown in FIG. 6, cache memory 304 is initially operating in a normal mode of operation, where Vcc is above Vcc (min). This may correspond, for example, to CPU 104 operating in a normal power mode. Because Vcc is above Vcc (min), it can be expected that no bitcell failures will occur. As such, in this mode, all four of ways 402, 404, 406, and 408 of cache memory 304 are made available for data caching, thereby configuring cache memory 304 for a maximum cache size.

Subsequently, cache memory 304 is re-configured into a low power mode of operation, with Vcc reduced below Vcc (min). In an embodiment, cache memory 304 is re-configured based on information contained in control signal 310 provided by MMU 306. In this example re-configuration, cache memory 304 is re-configured so that each of the ways 402, 404, 406, and 408 is partitioned between data hits and ECC bits. In an embodiment, the ratio of data to ECC bits is a function of the used error correction code and the supply voltage provided to cache memory 304. For example, if the supply voltage provided to cache memory 304 is only slightly below Vcc(min) and only single bit errors can be expected for this supply voltage, then Hamming codes can be used, with each way partitioned between m error correcting bits and $2^m-m-1$ data bits. As the bit failure rate increases (e.g., as the supply voltage is reduced further), each way can be (independently) configured to switch to a more aggressive error correction code, which reduces the data portion of the way.

In an embodiment, the error detection capability of an error correcting code is used to enable a feedback mechanism, based on which the error correction code used is adjusted. One property of error correcting codes is that they typically can detect more errors than they can correct. For example, a Hamming code can detect two bit failures but only correct one bit failure. As such, according to embodiments, the number of error detections versus the number of error corrections performed by the code can be used to refine the choice of error correcting code, and by consequence the ratio of data to ECC bits for each way. For example, when the error correcting code detects more errors than it can correct, this information is used as an indicator that a more aggressive error correction code may be needed. In embodiments, a first error correction code is used initially, and then adjusted based on the feedback information as appropriate to converge on the error correction code that optimizes the data to ECC bit allocation within the memory.

Figure 7:
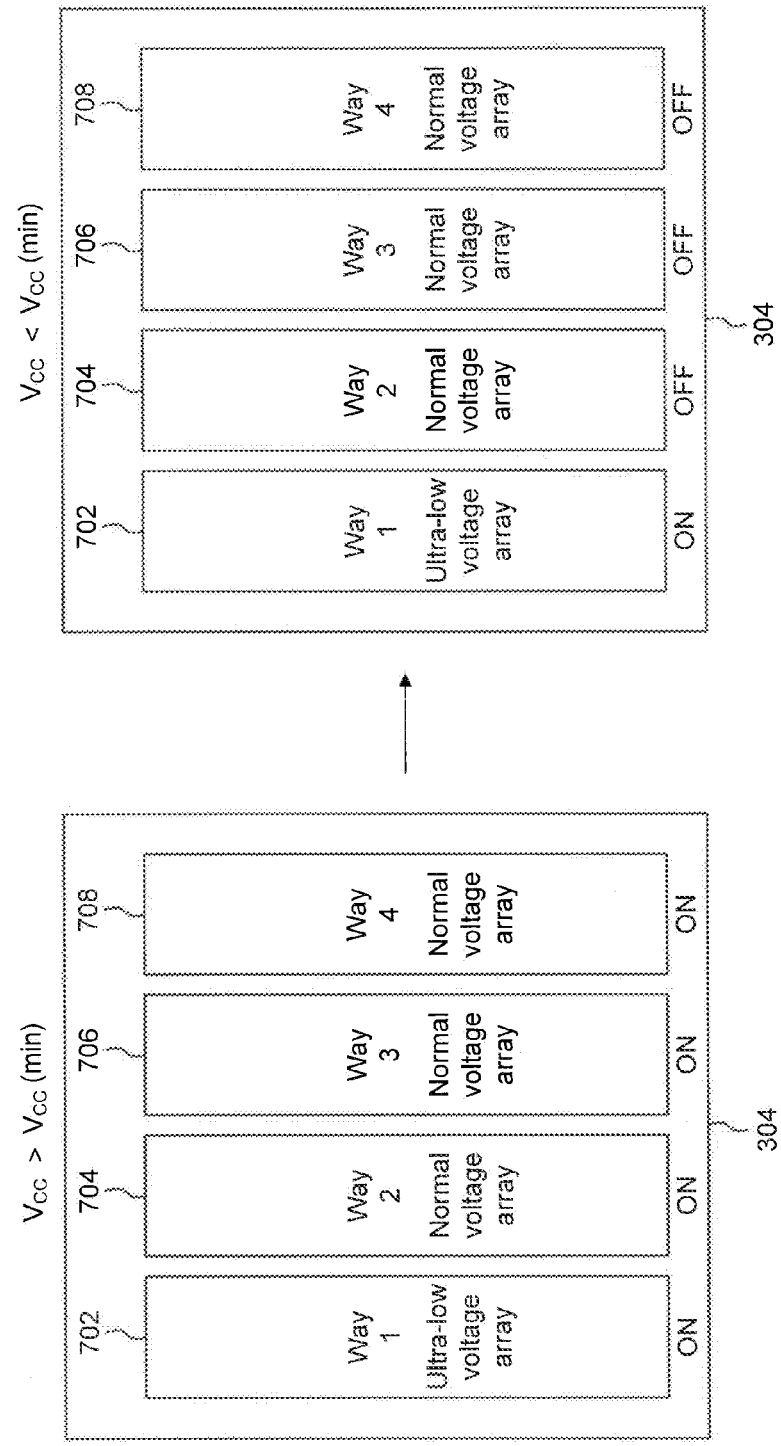
FIG. 7 illustrates an example re-configuration of an adaptive cache memory according to an embodiment of the present invention.

FIG. 7 illustrates another example re-configuration 700 of an adaptive cache memory according to an embodiment of the present invention. For the purpose of illustration, example re-configuration 700 is described with reference to cache memory 304, described above in FIG. 3. It is assumed, for the purpose of illustration, that cache memory 304 includes four ways 702, 704, 706, and 708, which provide a logical segmentation of cache memory 304. As described above, embodiments are not limited to cache memory or to memory segmented into ways.

Further, cache memory 304 is designed such that way 702 is an ultra-low voltage memory array and was 704, 706, and 708 are normal voltage memory array. For example, way 702 may use physically larger voltage bitcells (i.e., that operate with larger voltages) than ways 704, 706, and 708, which results in way 702 having higher stability than ways 704, 706, and 708 at Vcc below Vcc(min). Alternatively, or additionally, the bitcells of way 702 may use a more stable bitcell design (e.g., using more transistors) than the bitcells of ways 704, 706, and 708. Accordingly, way 702 can operate reliably (i.e., with low bitcell failures) at lower voltages than ways 704, 706, and 708. In an embodiment, way 702 may be slower than ways 704, 706, and 708, and can be configured to take an extra cycle, for example, to access.

In an embodiment, as shown in FIG. 7, cache memory 304 is initially operating in a normal mode of operation, where Vcc is above Vcc(min). As such, in this mode, all four of ways 702, 704, 706, and 708 of cache memory 304 are ON and made available for data caching. Thus, cache memory 304 is configured for maximum cache size.

Subsequently, cache memory 304 is re-configured into a low power mode of operation, with Vcc reduced below Vcc (min). In an embodiment, cache memory 304 is re-configured based on information contained in control signal 310 provided by MMU 306. In this example re-configuration, cache memory 304 is re-configured to retain only way 702 0N and to turn ways 704, 706, and 708 OFF. Because way 702 is an ultra-low voltage memory array, it will continue to operate reliably in this low power mode. Ways 704, 706, and 708, which may fail during this low power mode, are turned OFF to save power and/or because their reliability is anticipated to be very low in this mode. Accordingly, this reconfiguration trades off cache size for power savings, while maintaining high reliability for the operational portion of cache memory 304.

Example re-configuration 700 may be suitable for ultralow voltage modes of operation, where a high bitcell failure is anticipated for ways 704, 706, and 708. As such, turning OFF ways 704, 706, and 708 is a better option than retaining them with low reliability. Alternatively or additionally, the mode of operation may only require a small cache size, provided sufficiently by way 702. In another embodiment, when ways 704, 706, and 708 are turned off, way 702 is also re-configured from a write-back to a write-through writing policy, so that data written to the cache is synchronously also written to the main memory (whereas in write-back, data is written at some later time).

As would be understood by a person of skill in the art based on the teachings herein, other variants of example 700 may be used. For example, embodiments may use a mixed bitcell design (i.e., with ultra-low voltage and normal voltage arrays) as described in FIG. 7, and further apply any of the described way designation schemes (i.e., data versus ECC, redundancy, etc.). For example, in an embodiment, with a mixed bitcell design as described in FIG. 7, an ECC/redundancy scheme is applied to only one or more of the normal voltage memory arrays. Because no error correction is needed for the ultra-low voltage memory array, higher error correction efficiency can be provided for the normal voltage memory arrays, allowing both ultra-low voltage operation and high cache reliability.

In another variation of example 700, the low power mode of operation may retain all four of ways 702, 704, 706, and 7080N, but provides a lower voltage to way 702 than to ways 704, 706, and 708. Accordingly, power savings are achieved with respect to way 702, and the reliability and cache size of the cache are maintained the same. In a further variation, ways 702, 704, 706, and 708 have the same design (e.g., all normal voltage arrays). During testing, ways 702, 704, 706, and 708 are characterized so as to determine, for each way, the minimum voltage at which bit cell failures start occurring. Subsequently, during operation, different voltages may be provided to ways 702, 704, 706, and 708, the voltages reduced as appropriate (independently for each way) based on the minimum voltages determined during testing.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A computer system, comprising:
  a power management unit (PMU);
  a memory management unit (MMU); and
  a central processing unit (CPU) chip comprising a CPU and a memory having a plurality of ways,
  wherein the CPU is configured to determine a scheduled mode of operation of the computer system, and
  wherein the MMU is configured to receive a control signal from the PMU, the control signal indicating the scheduled mode of operation of the computer system, to determine, responsive to the scheduled mode of operation a ratio of data ways to error correction code (ECC) ways of the plurality of ways, and to configure the memory according to determined ratio.

2. The computer system of claim 1, wherein the PMU is configured to provide a supply voltage to the memory.

3. The computer system of claim 2, wherein the scheduled mode of operation is a low power/performance mode of the computer system, and wherein the supply voltage is lower than a predetermined minimum supply voltage of the memory during the scheduled mode of operation.

4. The computer system of claim 3, wherein the predetermined minimum supply voltage of the memory is determined by a voltage below which a first bitcell failure occurs in the memory.

5. The computer system of claim 2, wherein the scheduled mode of operation is a normal mode of the computer system, and wherein the supply voltage is at least equal to a predetermined minimum supply voltage of the memory during the scheduled mode of operation.

6. The computer system of claim 1, wherein the memory is a cache memory.

7. The computer system of claim 6, wherein the scheduled mode of operation is a low power/performance mode of the computer system, and wherein the MMU configures each of the plurality of ways as a data way or an ECC way, wherein the data way is designated to store data and the ECC way is designated to store error correcting code for data stored in data ways.

8. The computer system of claim 7, wherein the MMU configures at least one way of the plurality of ways as an ECC way and designates the at least one way to store error correcting code for more than one data way.

9. The computer system of claim 7, wherein the MMU configures at least one way of the plurality of ways as an ECC way and designates the at least one way to store error correcting code for only one data way.

10. The computer system of claim 9, wherein the only one data way is designated to store data of high priority.

11. The computer system of claim 7, wherein the MMU is configured to determine, for each of the plurality of ways configured as an ECC way, a type/rate of error correcting code based on the scheduled mode of operation.

12. The computer system of claim 6, wherein the scheduled mode of operation is a normal mode of the computer system, and wherein the MMU configures each of the plurality of ways as a data way, thereby configuring the cache memory for a maximum cache size.

13. The computer system of claim 6, wherein the plurality of ways include a first way designed for low supply voltage operation and a second way designed for normal supply voltage operation.

14. The computer system of claim 13, wherein the scheduled mode of operation is a low power/performance mode of the computer system, and wherein the MMU configures the first way to be ON and the second way to be OFF during the scheduled mode of operation.

15. The computer system of claim 13, wherein the scheduled mode of operation is a normal mode of the computer system, and wherein the MMU configures both the first way and the second way to be ON during the scheduled mode of operation.

16. The computer system of claim 6, wherein the scheduled mode of operation is a low power/performance mode of the computer system, and wherein the MMU configures at least one of the plurality of ways from a write-back write policy to a write-through write policy.

17. A computer system, comprising:
a power management unit (PMU);
a memory management unit (MMU); and
a memory having a plurality of ways,
wherein the MMU is configured to receive a control signal from the PMU, the control signal indicating at least one of a memory size requirement and a desired hit/miss rate of the memory, and to configure the memory responsive to the control signal.

18. A computer system, comprising:
a power management unit (PMU);
a memory management unit (MMU); and
a memory having a plurality of ways,
wherein the MMU is configured to receive a control signal from the PMU, the control signal indicating a scheduled mode of operation of the computer system, and to configure the memory according to the scheduled mode of operation of the computer system, and
wherein, when the scheduled mode of operation is a low power/performance mode of the computer system, the MMU is further configured to partition at least one way of the plurality of ways of the memory between data bits and error correction code (ECC) bits.

19. The computer system of claim 18, wherein the partition is adjusted dynamically based on one or more of: a supply voltage provided to the memory and an error correcting code of the ECC bits.

* * * * *